(12) United States Patent
Isoyan et al.

(10) Patent No.: US 8,473,271 B2
(45) Date of Patent: Jun. 25, 2013

(54) FAST PHOTOLITHOGRAPHY PROCESS SIMULATION TO PREDICT REMAINING RESIST THICKNESS

(75) Inventors: Artak Isoyan, Hillsboro, OR (US); Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 392 days.

(21) Appl. No.: 12/723,515

(22) Filed: Mar. 12, 2010

(65) Prior Publication Data

US 2011/0224963 A1 Sep. 15, 2011

(51) Int. Cl.
*G06F 17/50* (2006.01)

(52) U.S. Cl.
USPC .......................................................... 703/14

(58) Field of Classification Search
USPC .......................................................... 703/14
See application file for complete search history.

(56) References Cited

U.S. PATENT DOCUMENTS

| | | | | |
|---|---|---|---|---|
| 5,128,232 | A * | 7/1992 | Thackeray et al. | 430/192 |
| 6,790,598 | B2 * | 9/2004 | Burke et al. | 430/311 |
| 6,977,714 | B2 * | 12/2005 | Finders | 355/52 |
| 7,079,223 | B2 * | 7/2006 | Rosenbluth et al. | 355/67 |
| 7,235,336 | B1 * | 6/2007 | Gu | 430/30 |

OTHER PUBLICATIONS

S. Y. Lee and K. Anbumony, "Accurate control of remaining resist depth for nanoscale three-dimensional structures in electron-beam grayscale lithography," J. Vac. Sci. Technol. B, Microelectron. Nanometer Struct., vol. 25, No. 6, pp. 2008-2012, Nov. 2007.*

Ahn, C.-N. et al., "A Novel Approximate Model for Resist Process," Proc. SPIE, 1998, pp. 752-763, vol. 3334.

Brunner, T.A. et al., "Approximate Models for Resist Processing Effects," Proceedings of the International Society for Optical Engineering, Mar. 13-15, 1996, pp. 198-207, vol. 2726.

Cobb, N. et al., "Experimental Results on Optical Proximity Correction with Variable Threshold Resist Model," Proceedings of SPIE, Mar. 12-14, 1997, pp. 458-468, vol. 3051.

Dirksen, P. et al., "Determination of Resist Parameters Using the Extended Nijboer-Zernicke Theory," Proc. SPIE, 2004, 10 pages, vol. 5377.

Fukuda, H. et al., "Kinetic Model and Simulation for Chemical Amplification Resists," Journal of the Electrochemical Society, Feb. 1990, p. 675-679, vol. 137, No. 2.

Fukuda, H. et al., "Impact of Acid/Quencher Behavior on Lithography Performance," Optical Microlithography, Proceedings of SPIE, Progler, C.J. (Ed.), 2001, pp. 319-330, vol. 4346.

Hattori, K. et al., "The Accuracy of Simulation Based on the Acid-Quencher Mutual Diffusion Model in KrF Processes," Optical Microlithography XV, Proceedings of SPIE, Yen, A. (Ed.), 2002, pp. 1243-1253, vol. 4691.

(Continued)

*Primary Examiner* — Mary C Jacob
*Assistant Examiner* — Aniss Chad
(74) *Attorney, Agent, or Firm* — Fenwick & West LLP (57) ABSTRACT

A lithography model uses a transfer function to map exposure energy dose to the thickness of remaining photoresist after development; while allowing the flexibility to account for other physical processes. In one approach, the model is generated by fitting empirical data. The model may be used in conjunction with an aerial image to obtain a three-dimensional profile of the remaining photoresist thickness after the development process. The lithography model is generally compact, yet capable of taking into account various physical processes associated with the photoresist exposure and/or development process for more accurate simulation.

18 Claims, 5 Drawing Sheets

OTHER PUBLICATIONS

Hopkins, H.H., "On the Diffraction Theory of Optical Images," Proceedings of the Royal Society of London, Series A, Mathematical and Physical, May 7, 1953, pp. 408-432, vol. 217, No. 1130.

Hopkins, H.H., "The Concept of Partial Coherence in Optics," Proceedings of the Royal Society of London, Series A, Mathematical and Physical, Aug. 22, 1951, pp. 263-277, vol. 208, No. 1093.

Khan, M. et al., "A Semi-Empirical Resist Dissolution Model for Sub-Micron Lithographies," Technical Proceedings of the 1998 International Conference on Modeling and Simulation of Microsystems, Semiconductors, Sensors and Actuators (Applied Computational Research Society), 1998, pp. 41-46.

Levinson, H.J. et al., "Chapter 1: Optical Lithography," Hand book of Microlithography, Micromachining and Microfabrication. vol. 1: Microlithography, Rai-Choudhury, R. (Ed.), IEEE Materials and Devices Series 12, SPIE Press Monograph, 1997, 134 pages, vol. PM39.

Mack, C.A., "Development of Positive Photoresists," J. Electrochem. Soc.: Solid-State Science and Technology, Jan. 1987, pp. 148-152, vol. 134, No. 1.

Mack, C.A. et al., "A New Development Model for Lithography Simulation," Olin Microlothography Seminar, Interface '97, Nov. 9-11, 1997, pp. 55-66, vol. 97.

Mack, C.A. et al., "Notch Model for Photoresist Dissolution," Electrochemical and Solid-State Letters, Jul. 1998, pp. 86-87, vol. 1, No. 1.

Mack, C.A., "Evaluation of Proximity Effects Using Three-Dimensional Optical Lithography Simulation," Proceedings SPIE, Optical Microlithography IX, Mar. 13-15, 1996, p. 634-639, vol. 2726.

Poonawala, A. et al., "OPC and PSM Design Using Inverse Lithography: A Non-Linear Optimization Approach," Proc. SPIE, 2006, 14 pages, 61543H, vol. 6154.

Randall, K. et al., "Variable Threshold Resist Models for Lithography Simulation," Part of the SPIE Conference on Optical Microlithography XII, Mar. 1999, p. 176-182, vol. 3679.

Robertson, S. et al., "Towards a Universal Resist Dissolution Model for Lithography Simulation," Lithography for Semiconductor Manufacturing II, Proceedings of SPIE, 2001, pp. 111-122, vol. 4404.

Scheckler, E.W. et al., "Models and Algorithms for Three-Dimensional Topography Simulation with Sample-3D," IEEE Transactions on Computer-Aided Design of Integrated Circuits and Systems, Feb. 1994, pp. 219-230, vol. 13, No. 2.

Sethian, J.A., "Level Set Methods and Fast Marching Methods," Cambridge Monographs on Applied and Computational Mathematics, Cambridge University Press, 1996, 406 pages.

\* cited by examiner

FAST PHOTOLITHOGRAPHY PROCESS SIMULATION TO PREDICT REMAINING RESIST THICKNESS

FIELD OF THE INVENTION

The present invention is related to electronic design automation (EDA) for simulating resist exposure and development during an integrated circuit fabrication process. More specifically, it relates to a fast lithography model that predicts the thickness of remaining resist.

BACKGROUND OF THE INVENTION

Semiconductor integrated circuit (IC) fabrication processes involve complex physical and chemical interactions. As the semiconductor fabrication processes become more complex, it is becoming more difficult to predict the outcome of such physical and chemical interactions in the processes. Process models are developed to predict the outcome of these processes. Process models may be a physical model, a black box model or a combination of both. A physical model is based on an understanding of the actual physical processes that occur during a fabrication process and attempts to simulate those processes. Conversely, a black box model is typically a statistical manipulation relying on statistical tools to fit a model to empirical data, but the model itself may have no relation to the actual underlying physical processes.

Physical models tend to exhibit better interpolation and extrapolation results compared to black box models. However, physical models can be computationally complex to implement and may be incapable of accommodating a large number of process parameters that affect the outcome of a fabrication process. On the other hand, black box models can often be extended to accommodate various processing parameters. However, the black box model is only as good as the underlying empirical data, and can suffer from inaccuracy when interpolating or extrapolating from available data points.

Photolithography is the process of transferring patterns of geometric shapes on a mask to a thin layer of photosensitive material (resist) covering the surface of a semiconductor wafer. Photolithography is becoming a more sensitive and critical step in IC fabrication process as feature sizes shrink to ever smaller sizes. Various resolution enhancement techniques have been developed to form smaller features on the IC. One of such resolution enhancement techniques is optical proximity correction (OPC), which uses modified shapes in the mask geometry to account for proximity effects in the exposure process.

Proximity effects can include both an optical effect and a resist effect. The optical effect accounts for optical diffraction caused by patterns on the mask. The optical effect is well understood and analyzed by using Hopkins model, for example. In an actual photolithography process, the proximity effect is greater than anticipated by the optical model. The greater proximity effect is due to non-optical factors that are referred to as the resist component. The resist component includes, among others, acid diffusion, and duration and condition of pre-exposure bake and/or post-exposure bake.

Process models associated with photolithography include constant threshold (CTR) models and variable threshold (VTR) models. The CTR model assumes that any area on a wafer subject to optical energy dose above a constant threshold level is developed. The CTR model is compact, shows good interpolation/extrapolation results, and has low computation requirement. However, the CTR model is incapable of taking various process parameters into account.

On the other hand, most of the VTR model uses statistical tools to fit empirical data to an abstract model not related to the underlying physical processes. Although the VTR model is more advanced than the CTR model and uses statistical techniques to account for variations caused by various process parameters, the VTR model has less connection to the underlying physical processes associated with the photolithography process and, hence, shows limited accuracy when interpolating and extrapolating. Furthermore, the VTR model typically is more computationally intensive compared to the CTR model. The VTR model may also result in double contours instead of a single contour.

Other process models have been developed to account for the resist component of the proximity effect. Such models include, for example, the Mack kinetic development model, the Notch development model, the universal resist dissolution model, the extended Nijboer-Zernike model, acid diffusion models, acid-quencher diffusion models, and full three-dimensional resist development models. However, these models either lack accuracy or require extensive computational resources to simulate the photolithography process.

SUMMARY OF THE INVENTION

Embodiments of the present invention relate to modeling and simulating a photolithography process based on a model representing a relationship between an exposure energy dose and the post-development thickness of resist. In various embodiments, the model can also account for other physical processes that affect exposure and/or development of the resist.

In various aspects, distribution of exposure energy dose and one or more process variables are applied to the model. The process variables are for physical processes that affect the exposure and/or development of the resist. The post-development (i.e., remaining) thickness of resist at a location on the substrate is computed by using a transfer function that relates exposure energy dose to remaining resist thickness, but which also uses the process variables to account for effects of the other physical processes. This approach can be advantageous because the model is based on the underlying physical processes and therefore potentially performs better compared to purely black box models. On the other hand, the use of a transfer function directly relating exposure energy dose to remaining resist thickness generally requires far less computation than purely physical models.

In one approach, the transfer function is a parameterized function of the process variables, and the parameters are optimized with respect to empirical data concerning the exposure and/or development of resist.

The process variables can be used to account for many different physical processes. For example, the model may account for processes caused by aerial image intensity, acid diffusion, duration or condition of pre-bake or post-bake, and effects caused by geometry of the pattern. The process variables can includes "local" process variables and/or "global" process variables. Local process variables vary as a function of location on the substrate. For example, effects due to pattern geometry may be modeled using local process variables. Global process variables are constant over the entire substrate (i.e., independent of (x, y) location on the substrate). For example, effects due to pre- or post-bake may be modeled using global process variables.

In one embodiment, the transfer function predicts the remaining resist thickness as a function of both the exposure energy dose and a threshold energy dose. For example, the threshold energy dose may be the minimum exposure dose for starting the resist development. In some approaches, the transfer function is a function of the difference between the actual exposure dose and the minimum exposure dose. In another aspect, the effects of the process variables are all accounted for in determining the threshold energy dose.

Other aspects of the invention include methods, computer systems and computer readable storage media related to the foregoing. Yet other aspects include pre- or post-processing steps for the foregoing, or applications that make use of the foregoing.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the present invention can be readily understood by considering the following detailed description in conjunction with the accompanying drawings.

DETAILED DESCRIPTION OF THE INVENTION

A preferred embodiment of the present invention is now described with reference to the figures where like reference numbers indicate identical or functionally similar elements.

Embodiments relate to generating and simulating a lithography model representing a relationship between an exposure energy dose and the thickness of the remaining resist after a development process. In one approach, parameters for the lithography model are generated by fitting to empirical data associated with resist exposure and/or development. The model may be used in conjunction with an aerial image to obtain the three-dimensional profile of post-development resist thickness. The lithography model is compact yet capable of taking into account various physical processes associated with the resist exposure and/or development process for more accurate simulation. Further, the lithography models of various embodiments are derived from a physical model of the lithography process, and hence, show more accurate interpolation or extrapolation results compared to other models.

Overview of Process Simulation Device

Figure 1:
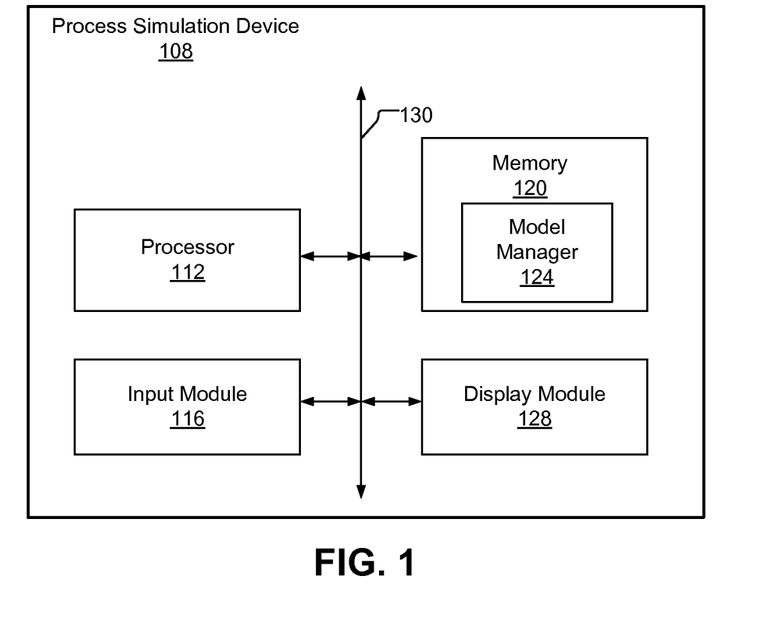
FIG. 1 is a block diagram illustrating a process simulation device for modeling a photolithography process, according to one embodiment.

FIG. 1 is a block diagram illustrating a process simulation device 108 for modeling a photolithography process, according to one embodiment. The process simulation device 108 may be a general purpose computing device capable of running one or more application programs associated with modeling and/or simulating semiconductor integrated circuits (IC) and their fabrication processes. Alternatively, the process simulation device 108 may be a computing device that is dedicated to such modeling and/or simulation. Although illustrated in FIG. 1 as a single device, the process simulation device 108 may be a cluster of multiple computing devices operating in concert for an enhanced processing speed and to share resources.

The process simulation device 108 may include, among other components, a processor 112, a memory 120, an input module 116, a display module 128 and a bus 130 connecting these components. The components of the process simulation device 108 in FIG. 1 are merely illustrative. The process simulation device 108 may also include components not illustrated in FIG. 1. For example, the process simulation device 108 may include a network card for communicating with other computing devices over a network. Further, the process simulation device 108 may omit components illustrated in FIG. 1. For example, the input module 116 or the display module 128 may be omitted from the process simulation device 108.

The processor 112 executes computer instructions stored in the memory 120. Although only a single processor is illustrated in FIG. 1, two or more processors may be used to increase the computing speed.

The memory 120 is a computer readable storage medium that stores, among other data, a model manager 124. The model manager 124 is a software module storing instructions for processing, storing and/or retrieving data associated with generating a lithography model and performing simulation based on the lithography model, as described below in detail with reference to FIG. 2. The memory 120 may also include other software modules associated with optical proximity correction (OPC) calibration tools such as ProGen and ProGenPlus available from Synopsys, Inc. of Mountain View. In one embodiment, the memory 120 is a combination of a primary storage device (e.g., Random-Access Memory (RAM)) and a secondary storage device (e.g., a hard disk).

The input module 116 is a user interface component for receiving user input associated with modeling and simulating the IC fabrication process. In one embodiment, the input module 116 includes keyboards and a pointing device (e.g., a mouse).

The display module 128 is hardware, software, firmware or a combination thereof for presenting visual information associated with modeling and/or simulating an IC fabrication process to a user. The display module 128 may include, for example, a graphic processing unit (GPU) and a signal interface for communicating signals with a display monitor (e.g., a liquid crystal display (LCD) monitor).

Structure of Model Manager

Figure 2:
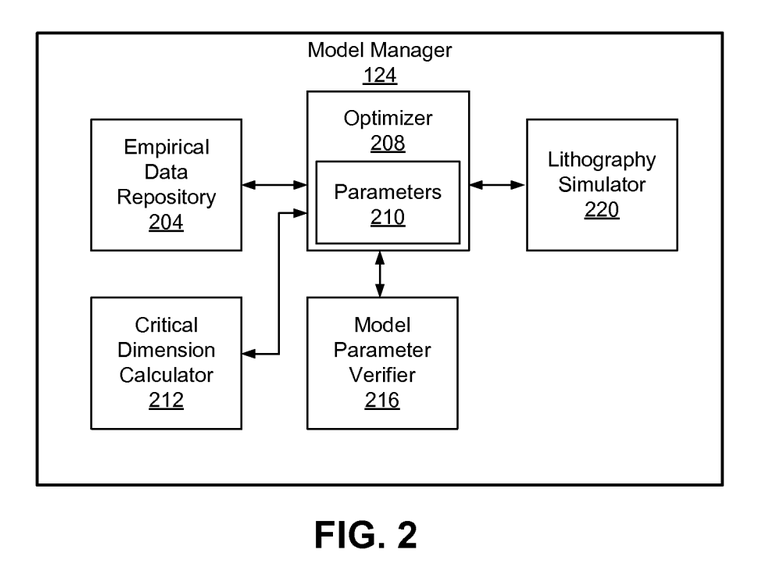
FIG. 2 is a block diagram illustrating a model manager, according to one embodiment.

The model manager 124 determines parameters 210 for fitting a parameterized lithography model to empirical data, and performs simulation of a photolithography process based on the fitted model. The model manager 124 may operate in conjunction with other software modules stored in the memory 120 to perform resolution enhancement operations such as OPC or other EDA operations. Alternatively, the parameters generated by the model manager 124 may be sent to other computing devices for possible use in various other EDA operations.

The model manager 124 may consist of multiple functional software modules. In one embodiment, the model manager 124 includes, among other components, an empirical data repository 204, an optimizer 208, a critical dimension calculator 212, a model parameter verifier 216 and a lithography simulator 220. One or more of these computing modules may be combined into a single computer instruction module. Further, the model manager 124 may include other software modules not illustrated in FIG. 2.

The empirical data repository 204 stores empirical data obtained from one or more fabricated wafers. The empirical data may be obtained by forming test patterns using electronic design automation (EDA) tools, transferring the test patterns to wafers via photolithography processes, and then taking measurements of structural features on the fabricated wafers. The empirical data may include, for example, critical dimension data. The empirical data repository may also include various process variables that affect resist exposure and/or development. Each process variable represents a factor that affects the resist exposure and/or development. For example, process variables may include type or characteristics of resist material, variable characterizing acid diffusion and information about pattern geometry.

The optimizer 208 executes one or more optimization algorithms to produce parameters 210 for the lithography model. In one approach, the optimizer 208 initializes parameters 210 and then repeatedly updates the parameters 210 until predictions from the lithography model closely match the empirical data.

In FIG. 2, the optimizer 208 generates parameters 210 based on matching critical dimensions. The critical dimension calculator 212 predicts critical dimensions based on the parameters 210. The computed critical dimensions are provided to the optimizer 208 for comparison with corresponding critical dimensions derived from the empirical data. In one embodiment, the critical dimension calculator 212 computes the contour of the developed resist and determines the critical dimensions based on the contour, as described below in detail with reference to FIG. 6. The optimizer 208 adjusts the parameters 210 to attempt to match the critical dimension predicted by the lithography model against those based on empirical data.

In one embodiment, the model parameter verifier 216 receives the parameters 210 from the optimizer 208 and validates the lithography model using one or more criteria. For example, a known resist contrast of a resist material may be compared with a resist contrast derived from the lithography model. If the discrepancy between the known resist contrast and the computed resist contrast exceeds a threshold, the model manager 124 may perform further optimization on the lithography model or alert the discrepancy to the user for further operations.

The lithography simulator 220 simulates a photolithography process based on the aerial image intensity, parameters 210 and process variables (e.g., type of resist, acid diffusion, duration and/or condition of pre-exposure bake or post-exposure bake and pattern geometry), as described below in detail with reference to FIG. 7.

Example Lithography Model

Figure 3A:
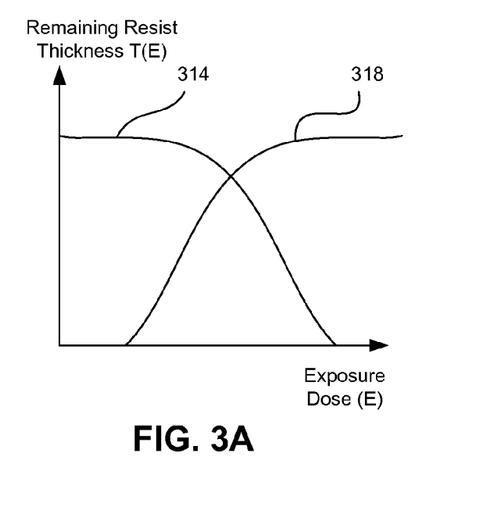
FIG. 3A is a graph illustrating a relationship between the post-development thickness of resist and an energy exposure dose, according to one embodiment.

The lithography models according to embodiments assume that the thickness T of the remaining resist at a location of the wafer is a function F of the exposure energy dose E at the same location (i.e., T=F(E)). For convenience, the function F will be referred to as a transfer function since it relates exposure energy dose E to corresponding resist thicknesses T, albeit with some adjustments as described below. FIG. 3A is a graph illustrating a relationship between a post-development resist thickness and an energy exposure dose. Line 314 represents the relationship for a positive tone resist, and line 318 represents the relationship for a negative tone resist. The specific shape of lines 314, 318 differs depending on the specific resist material and various process variables. Embodiments provide a lithography model that accurately models such variants in resist materials and other process variables.

In one embodiment, a sigmoid function is used to represent the transfer function between the post-development thickness T of the remaining resist and the exposure energy dose E because their relationship as illustrated in FIG. 3A closely resembles the sigmoid function. That is, the relationship between T and E is expressed in the following equation:

$$T = \text{sigmoid}(E) = \frac{T_U}{1 + e^{tone*a*(E-b)}} \quad (1)$$

where $T_U$ is the resist thickness at the unexposed area of the wafer, tone is the tone of the resist, a is a parameter associated with the slope of the sigmoid function, and b is a parameter for shifting the sigmoid function along an E axis. Equation (1) is modified, as described below in detail with reference to equations (3) and (4), to account for process variables and to better fit the transfer function to empirical data. The sigmoid function is merely illustrative. Various other functions may be used as a starting point for deriving an appropriate transfer function for the lithography model.

Figure 3B:
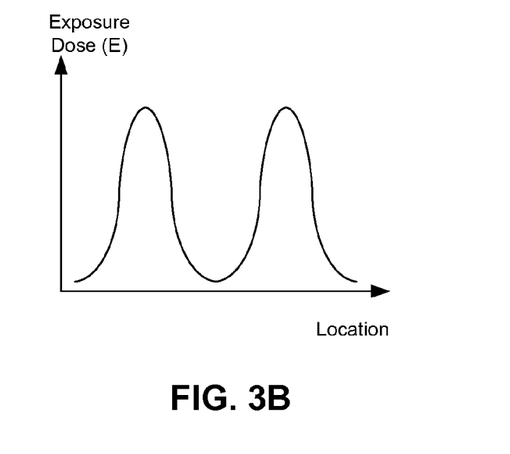
FIG. 3B is an aerial image illustrating the exposed energy intensity at different locations on a wafer, according to one embodiment.

The exposure energy dose E at an (x,y) position on the wafer may be expressed in the following equation:

$$E(x,y) = I(x,y,z_f)*t \quad (2)$$

where $I(x,y,z_f)$ is an aerial image intensity at (x,y) coordinate in the $z_f$ focal plane, and t is the exposure time to an optical energy source. An example distribution of exposure energy dose E(x,y) is illustrated in FIG. 3B.

Figure 5:
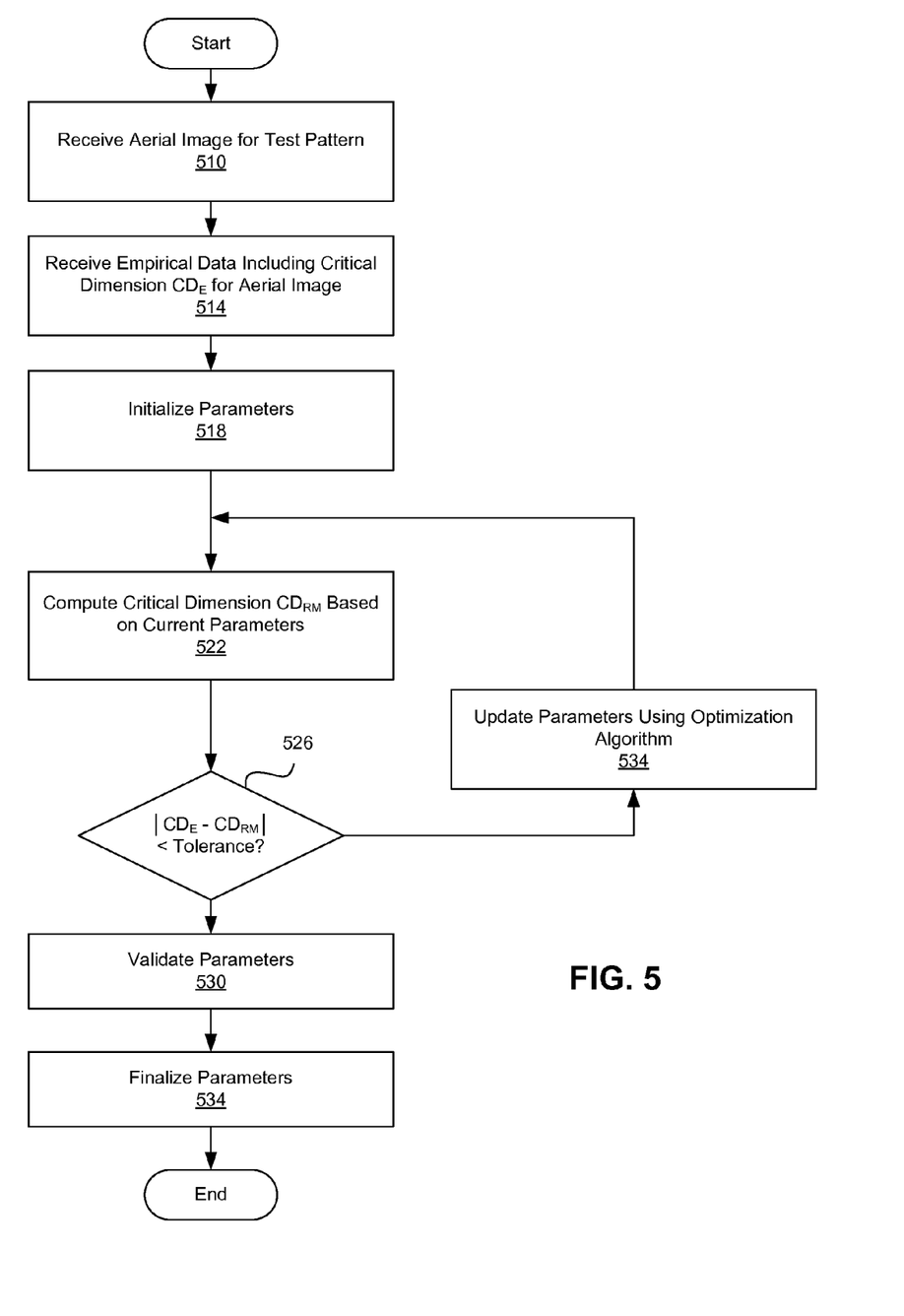
FIG. 5 is a flowchart illustrating a process for determining parameters for a lithography model, according to one embodiment.

In one embodiment, the process variables are incorporated into a term $E_{thresh}$ that represents a minimum required exposure dose to start resist development. More specifically, $E_{thresh}$ can be expressed in the following equation:

$$E_{thresh} = C_0 + C_1*A_1 + C_2*A_2 + \ldots + C_N*A_N \quad (3)$$

where each of $A_1$ through $A_N$ are terms that account for different physical processes that may affect resist exposure and/or development, and each of $C_1$ through $C_N$ represents a parameter associated with the corresponding process term $A_1$ through $A_N$. The physical processes may be characterized by process variables $p_1$ through $p_N$, in which case the terms $A_1$ through $A_N$ would be functions of the process variables $p_1$ through $p_N$. $C_0$ is a parameter that is not associated with any process variable. The parameters $C_0$ through $C_N$ are initialized and updated by the optimizer 208 to match the empirical data, as described below in detail with reference to FIG. 5.

Some of the process variables $p_1$ through $p_N$ (and corresponding term $A_1$ through $A_N$) may be local in the sense that they vary as a function of the location (x,y) on the wafer. Examples of local process variables include those associated with pattern geometry, and density of patterns in a local region, aerial image intensity and aerial image modulation. Others of the process variables $p_1$ through $p_N$ may represent global processes that do not vary across the entire wafer. Global process variables may be associated with, for example, acid diffusion, duration and/or condition of pre-bake and/or post-bake process. Equation (3) is merely illustrative. Other equations for obtaining $E_{thresh}$ may include terms with logarithmic functions or other non-linear terms. For example, $E_{thresh}$ may be defined as $E_{thresh}=C_0+C_1*E^2(x,y)$. More complex equations for $E_{thresh}$ may result in more accurate description of the resist development processes but at the cost of higher computational requirements.

Furthermore, the energy dose threshold $E_{thresh}$ may vary as a function of (x,y), for example if it is a function of local process variables. It may also be a function of the surrounding region. That is, $E_{thresh}(x,y)$ calculated at a specific location $(x_0,y_0)$ may not be a function solely of process variable evaluated at $(x_0,y_0)$. It may also be a function of process variables evaluated at locations other than $(x_0,y_0)$, for example if a process term $A_i$ involves a convolution.

In one embodiment, equation (1) is modified to add $E_{thresh}$ into the sigmoid function as expressed in the following equation:

$$T(x,y) = \frac{T_U}{1 + e^{tone*a*(E(x,y)-E_{thresh}(x,y))+d}} \quad (4)$$

where $T_U$ is the resist thickness at the unexposed area of the wafer (for positive resist) or fully exposed area of the wafer (for negative resist), tone is the tone of the resist, a is a parameter associated with the slope of the modified sigmoid function, and d is a constant value for normalizing equation (4). The tone value is 1 for a positive resist and −1 for a negative resist. a is one of the parameters that is computed by optimizer 208. Equation (4) is merely illustrative. Other modifications may be made to equation (1) to represent the thickness distribution T(x,y) as a function of the energy dose distribution E(x,y) and threshold energy dose $E_{thresh}$.

Modifying equation (1) to equation (4) allows various process variables to be taken into account to better simulate the photolithography process. In the simplest form of equation (3) where $E_{thresh}$ equals $C_0$, the lithography model of equation (4) reduces to a constant threshold (CTR) model. By expanding equation (1) to equation (4), the lithography model may account for additional process variables $A_1$ through $A_N$. With parameters in addition to $C_0$, the lithography model as represented by equation (4) can be more accurately fitted to represent variations in the photolithography process caused by differences in the process variables.

Figure 4:
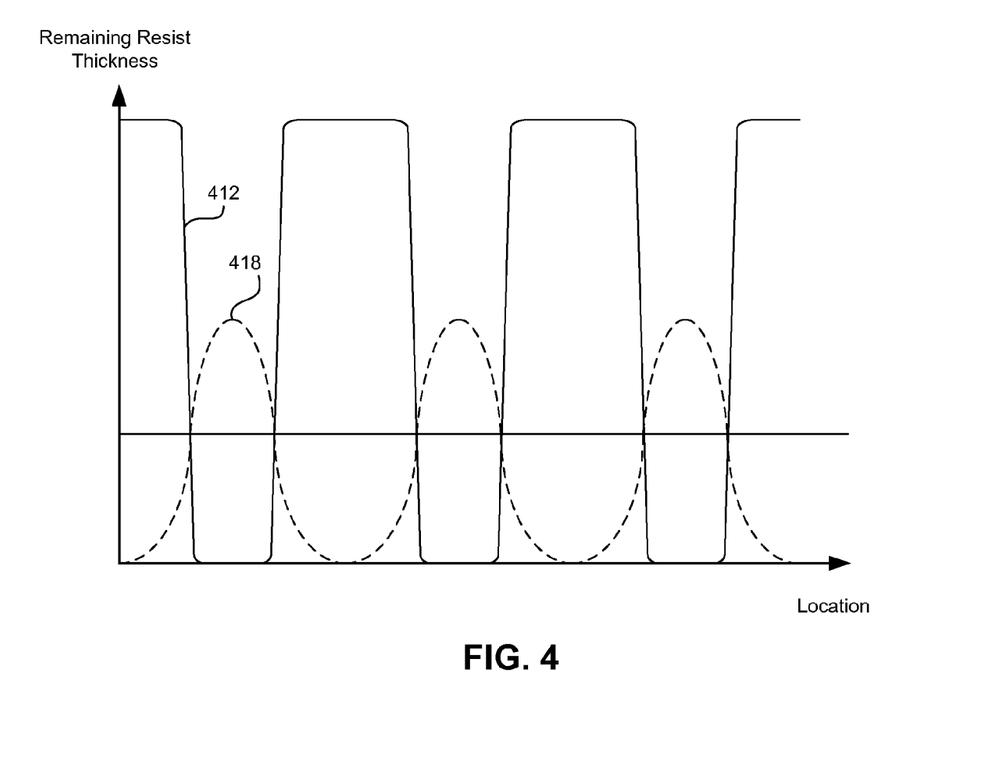
FIG. 4 is a graph illustrating the profile of post-development resist thickness at different locations of the wafer, according to one embodiment.

FIG. 4 is a graph illustrating an example post-development thickness profile of resist remaining at different locations based on equation (4). Line 412 indicates the post-development thickness of the resist at different locations and line 418 indicates the exposure energy dose E(x,y) at corresponding locations. In the example of FIG. 4, the resist has a positive tone. Therefore, the post-development resist thickness decreases as the energy dose E(x,y) increases.

One of many advantages associated with using this type of lithography model is that a two-dimensional aerial image may be used to obtain a three-dimensional post-development resist thickness profile. A CTR model or a VTR model is incapable of producing such three-dimensional profiles of remaining resist. The three-dimensional resist thickness profile allows more accurate detection of design issues as well as allowing a user to perform EDA operations otherwise not possible. For example, etching through the remaining resist (of variable thickness) can be more accurately modeled.

Another advantage is that the lithography models are based on physical principles underlying the resist exposure and development process. Hence, embodiments are likely to produce more accurate extrapolation or interpolation results from existing data points compared to other lithography models based purely on statistical modeling unconnected to the underlying physical processes.

Example Method of Optimizing Parameters for a Lithography Model

FIG. 5 is a flowchart illustrating a process of generating parameters for a lithography model, according to one embodiment. The model manager 124 receives 510 an aerial image for forming a test pattern on a wafer. Based on the received aerial image and equation (2), the model manager 124 computes a distribution of exposure energy dose E(x,y) at locations across the wafer.

The empirical data corresponding to the test pattern are received 514 and stored in the empirical data repository 204. The empirical data may include critical dimensions $CD_E$ measured from wafers fabricated to include the test pattern.

The optimizer 208 initializes 518 the parameters 210 for the lithography model. In one embodiment, the lithography model is represented by equations (3) and (4). The parameters 210 include $C_0$ through $C_N$ (for computing $E_{thresh}$) and sigmoid slope value a. The critical dimension calculator 212 computes 522 critical dimensions $CD_{RM}$ based on the parameters 210 received from the optimizer 208, as described below in detail with reference to FIG. 6.

The critical dimension calculator 212 provides the computed critical dimensions $CD_{RM}$ to the optimizer 208. The optimizer 208 compares 526 the computed critical dimensions $CD_{RM}$ with the empirical critical dimensions $CD_E$. If the difference between $CD_{RM}$ and $CD_E$ exceeds a tolerance value, the parameters 210 are updated 534 using an optimization algorithm. The process returns to computing 522 the critical dimensions $CD_{RM}$ and comparing 526 computed critical dimensions $CD_{RM}$ and empirical critical dimensions $CD_E$. If the difference between $CD_{RM}$ and $CD_E$ does not exceed the tolerance value, the optimizer 208 outputs the parameters 210 to the model parameter verifier 216.

In optional step 530, the model parameter verifier 216 validates 530 the parameters 210 received from the optimizer 208. In one embodiment, the model parameter verifier 216 compares a resist contrast computed based on the parameters with the known resist contrast value of the resist. The resist contrast can be derived from the slope at the bottom of the curve represented by equation (4) where the remaining resist thickness becomes zero. An approximation of the resist contrast y derived from equation (4) is:

$$\gamma = \left[\log\left(\frac{2*E_{max}}{E_{max}+C_0}\right)\right]^{-1} \quad (5)$$

where $E_{max}$ represents exposure dose necessary to fully develop the photoresist. The model parameter verifier 216 validates 530 the parameters 210 if the deviation of the computed resist contrast from the known resist contrast value is within a tolerance value.

The verification based on the resist contract and equation (4) is merely illustrative. Various other known physical properties of the resist may be compared with physical properties computed from the parameters to validate the parameters 210.

If the parameters 210 fail validation at the model parameter verifier 216, the model manager 124 may alert the user or perform another round of optimization based on a different set of initial parameters.

Although the embodiment of FIG. 5 is described using the critical dimension as the optimization criteria, different properties or characteristics of a processed wafer may also be used to determine the accuracy of the lithography model. For example, in patterns with significant profile slope, critical dimensions measured at top or bottom, SEM (Scanning Electron Microscope) images with or without bridging or pinching may be used for driving the optimization algorithm.

Figure 6:
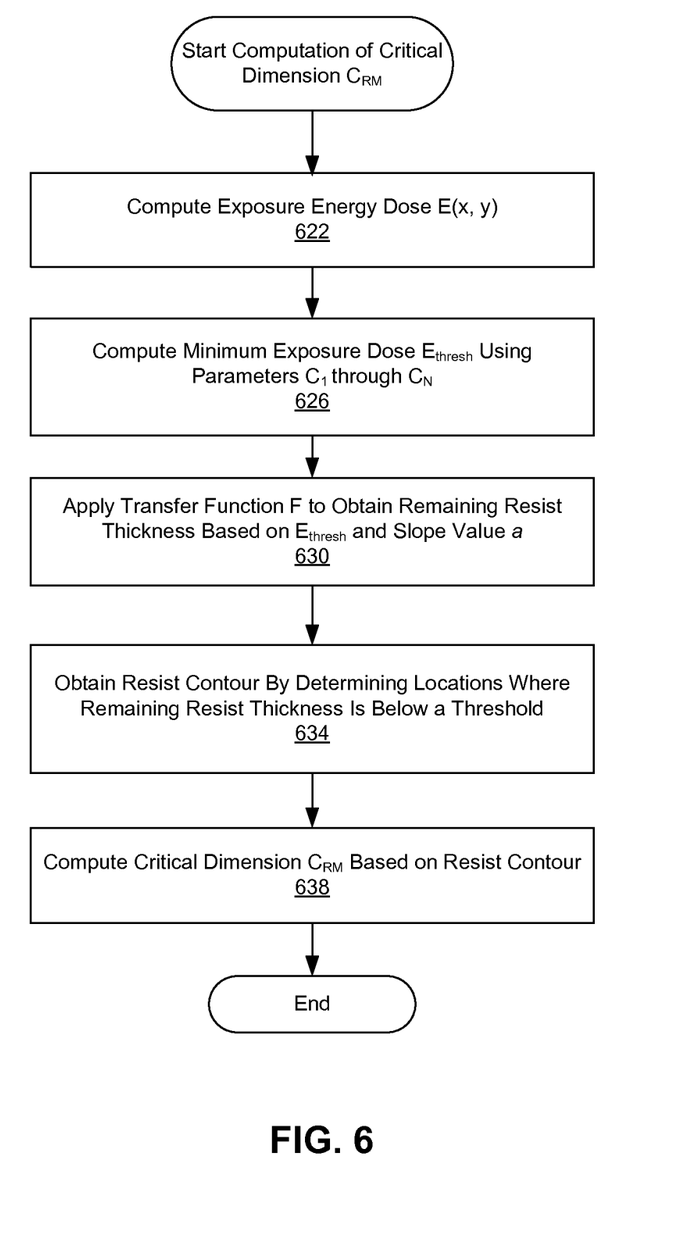
FIG. 6 is a flowchart illustrating a process of computing a critical dimension on a wafer based on a lithography model, according to one embodiment.

FIG. 6 is a flowchart illustrating a process of computing the critical dimension $CD_{RM}$, according to one embodiment. The critical dimension calculator 212 computes 622 the exposure energy dose distribution E(x,y) from the received aerial image using equation (2). Then the critical dimension calculator 212 computes the minimum exposure dose $E_{thresh}$ based on parameters $C_0$ through $C_N$ and the values of the process variables according to equation (3). If local process variables are used, different $E_{thresh}$ values are computed for different locations on the wafer. If only global parameters are used in describing $E_{thresh}$, the same $E_{thresh}$ value can be used across the entire wafer.

Based on the computed $E_{thresh}$ and the sigmoid slope value a, the critical dimension calculator 212 applies the transfer function of equation (4) to obtain 630 a distribution of the post-development remaining resist thickness. Transfer functions (with different $E_{thresh}$ values) may be obtained for different regions or locations on the wafer if $E_{thresh}$ includes one or more local process variables.

In one embodiment, the critical dimension calculator 212 then thresholds 634 the remaining resist thickness distribution T(x,y) to obtain a resist contour. In other words, a constant threshold model is used to determine the resist contour on the wafer. In another embodiment, a variable value is used instead of the constant value to determine the resist contour. Based on the contour of the region, the critical dimension calculator 212 computes 638 the critical dimension $C_{RM}$ by using known methods.

The sequence of steps illustrated in FIG. 6 is merely illustrative. Multiple steps may be performed in parallel or steps may be performed in a different order. For example, computing 622 the exposure energy dose E(x,y) may be performed in parallel or after computing 626 the minimum exposure dose $E_{thresh}$.

Example Simulation Based on Lithography Model

Figure 7:
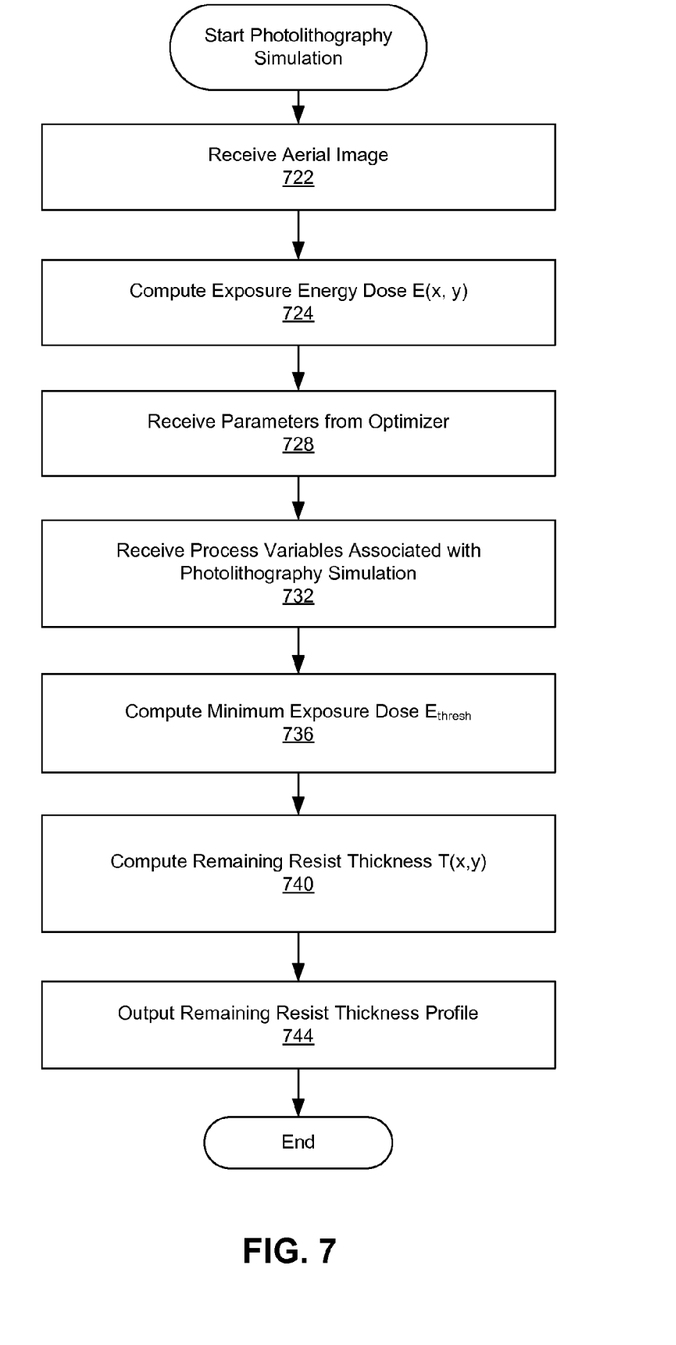
FIG. 7 is a flowchart illustrating a process of simulating a photolithography process, according to one embodiment.

FIG. 7 is a flowchart illustrating a process of simulating a photolithography process, according to one embodiment. The process of performing simulation using the lithography model is substantially identical to the process of computing the critical dimensions as illustrate in FIG. 6 except that the contour and/or distribution of the remaining resist thickness are obtained as end results instead of the critical dimensions.

The lithography simulator 220 receives 722 an aerial image for simulation. The lithography simulator 220 computes 724 the exposure energy dose distribution E(x,y) based on the received aerial image and equation (2).

The lithography simulator 220 also receives 728 the parameters 210 from the optimizer 208. The lithography simulator 220 further receives 732 process variables associated with the simulated photolithography process. Based on the parameters and the process variables, the lithography simulator 220 computes 736 the minimum exposure dose $E_{thresh}$ according to equation (3). $E_{thresh}$ may vary as a function of (x,y).

Based on equation (4) and computed $E_{thresh}$, the remaining resist thickness distribution T(x,y) is computed 740. The lithography simulator 220 outputs 744 the profile of the remaining resist thickness T(x,y).

In one embodiment, the profile of the remaining resist thickness may be rendered in a two dimensional image where different colors or levels of brightness represent different post-development thickness of the remaining resist. In another embodiment, the profile of the remaining resist thickness is provided to a software module for performing an OPC operation or other EDA operations.

Further Examples

The lithography model according to embodiment may be used for various purposes including, among others, the resolution enhancement process. Resolution enhancement relates to manipulating geometries of the layout to improve manufacturability of an IC design. Example software products for such resolution enhancement process include ProGen or ProGenPlus available from Synopsys, Inc. of Mountain View, Calif. The lithography model may also be used for other EDA processes such as a physical verification process where the design is checked for manufacturing issues.

Embodiments are capable of taking into account various process variables that could not be accounted for in simple lithography model and could only be accommodated in complex lithography models that require a large increase in computation requirement. The lithography models according to embodiments are compact, and hence, minimally increases the computation compared to conventional lithography models. Yet, the lithography model is capable of accurately simulating the proximity effect by generating a three-dimensional remaining resist profile useful for various EDA processes such as the OPC operation. Further, the lithography models of the embodiments are based on a physical model of the lithography process, and hence, interpolation or extrapolation from data points is likely to yield more accurate simulation result compared to other models.

Although the present invention has been described above with respect to several embodiments, various modifications can be made within the scope of the present invention. Accordingly, the disclosure of the present invention is intended to be illustrative, but not limiting, of the scope of the invention, which is set forth in the following claims.

What is claimed is:

1. A computer-implemented method for modeling and simulating a photolithography process using resist to fabricate a pattern on a substrate, the method comprising:
   receiving an exposure energy dose distribution;
   receiving at least one process variable for at least one physical process that affects exposure or development of the resist; and
   at a computing device, applying a transfer function to the exposure energy dose distribution to compute a remaining resist thickness distribution, where the transfer function predicts a remaining resist thickness at a specific location as a function of (a) exposure energy dose at the specific location, (b) the at least one process variable to account for effects of the at least one physical process and (c) exposure energy dose at locations other than the specific location.

2. The method of claim 1, wherein the transfer function predicts the remaining resist thickness distribution as a parameterized function of the at least one process variable, the parameterized function having parameters that are optimized with respect to empirical data concerning the exposure or development of resist.

3. The method of claim 2, wherein the parameters are optimized with respect to empirical measurements of critical dimensions.

4. The method of claim 1, wherein the at least one process variable comprise at least one process variable that varies as a function of coordinates of locations on the substrate.

5. The method of claim 1, wherein the at least one process variable comprise at least one process variable that is independent of locations on the substrate.

6. The method of claim 1, wherein the at least one physical process comprise at least one of a process caused by aerial image intensity, acid diffusion, duration or condition of pre-bake or post-bake, and effects caused by geometry of the pattern.

7. The method of claim 1, wherein the transfer function predicts a remaining resist thickness at a specific location further as a function of at least one process variable at a location other than the specific location.

8. The method of claim 1, wherein the transfer function predicts a remaining resist thickness at a specific location further as a function of a threshold energy dose at the specific location, where the threshold energy dose varies as a function of location on the substrate.

9. The method of claim 8, wherein the threshold energy dose is a minimum exposure dose for starting resist development.

10. The method of claim 8, wherein all effects of the at least one process variable are accounted for in the threshold energy dose.

11. The method of claim 8, wherein the threshold energy dose is a parameterized function of all of the at least one process variable, the parameterized function having parameters that are optimized with respect to empirical data concerning the exposure and/or development of resist.

12. The method of claim 8, wherein the transfer function is a function of a difference between the exposure energy dose and the threshold energy dose.

13. The method of claim 8, wherein the transfer function is a sigmoid function of a difference between the exposure energy dose and the threshold energy dose.

14. The method of claim 8, wherein $$T(x, y) = \frac{T_U}{1 + e^{tone * a * (E(x,y) - E_{thresh}(x,y)) + d}}$$

where T(x,y) is resist thickness distribution, $T_U$ is a resist thickness at an area where the resist is not removed from the substrate, tone represents a tone of the resist, a is a parameter associated with a slope of the transfer function, and d is a parameter of constant value.

15. The method of claim 1, further comprising:
applying a threshold to the computed remaining resist thickness distribution to predict contours of remaining resist.

16. The method of claim 1, further comprising:
performing an optical proximity correction (OPC) operation based on the computed remaining resist thickness distribution.

17. A computing device for modeling and simulating a photolithography process using resist to fabricate a pattern on a substrate, the computing device comprising:
a processor;
a lithography simulator configured to:
receive an exposure energy dose distribution;
receive at least one process variable for at least one physical process that affects exposure and/or development of the resist; and
apply a transfer function to the exposure energy dose distribution to compute a remaining resist thickness distribution, where the transfer function predicts a remaining resist thickness at a specific location as a function of (a) exposure energy dose at the specific location, (b) as a parameterized function of the at least one process variable to account for effects of the at least one physical process, and (c) exposure energy dose at locations other than the specific location; and
an optimizer module configured to:
optimize parameters of the parameterized function with respect to empirical data concerning the exposure and/or development of resist; and
store said optimized parameters.

18. A non-transitory computer readable storage medium structured to store instructions, the instructions when executed, cause a processor to:
receive an exposure energy dose distribution;
receive at least one process variable for at least one physical process that affects exposure and/or development of the resist; and
apply a transfer function to the exposure energy dose distribution to compute a remaining resist thickness distribution, where the transfer function predicts a remaining resist thickness at a specific location as a function of (a) the exposure energy dose at the specific location, (b) the at least one process variable to account for effects of the at least one physical process, and (c) exposure energy dose at locations other than the specific location.

* * * * *